United States Patent
Lee

(10) Patent No.: US 9,362,945 B2
(45) Date of Patent: Jun. 7, 2016

(54) APPARATUS AND METHOD FOR PROVIDING INTERFACE BETWEEN MODEM AND RF CHIP

(71) Applicant: Samsung Electronics Co., Ltd., Suwon-si, Gyeonggi-do (KR)

(72) Inventor: Jong-Woo Lee, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/705,529
(22) Filed: Dec. 5, 2012

(65) Prior Publication Data
US 2013/0142232 A1    Jun. 6, 2013

(30) Foreign Application Priority Data

Dec. 6, 2011 (KR) .................. 10-2011-0129544

(51) Int. Cl.
*H03M 3/00* (2006.01)
*H04B 1/40* (2015.01)
*H04L 27/06* (2006.01)

(52) U.S. Cl.
CPC ............... *H03M 3/462* (2013.01); *H04B 1/40* (2013.01); *H04L 27/06* (2013.01); *H03M 3/466* (2013.01)

(58) Field of Classification Search
CPC ........... H03M 3/00; H03M 3/30; H03M 1/00; H03M 1/12; H03M 1/207; H03M 3/458
USPC .......... 341/143, 155, 159; 375/260, 316, 267, 375/295, 297; 455/112, 130, 132, 205, 208, 455/260–263
See application file for complete search history.

(56) References Cited

U.S. PATENT DOCUMENTS

| | | | |
|---|---|---|---|
| 4,999,798 A * | 3/1991 | McCaslin | H03H 17/0671 708/313 |
| 5,182,642 A | 1/1993 | Gersdroff et al. | |
| 5,600,674 A | 2/1997 | Bonet et al. | |
| 6,326,912 B1 * | 12/2001 | Fujimori | 341/143 |
| 6,509,790 B1 | 1/2003 | Yang | |
| 6,657,574 B1 | 12/2003 | Rhode | |
| 7,231,193 B2 * | 6/2007 | Ramachandran | H03F 1/30 375/319 |
| 7,398,067 B2 * | 7/2008 | Wolf | H04B 1/28 455/137 |
| 8,249,543 B2 * | 8/2012 | Tuttle | H04B 1/30 375/134 |
| 8,478,336 B2 * | 7/2013 | Trachewsky | H04B 1/0003 370/278 |
| 2004/0057534 A1 * | 3/2004 | Masenten | H03M 3/334 375/316 |
| 2005/0168365 A1 | 8/2005 | Kaplan | |
| 2007/0080835 A1 * | 4/2007 | Maeda | H03D 3/009 341/120 |
| 2007/0086547 A1 * | 4/2007 | Sobchak | H04L 27/3809 375/345 |
| 2007/0200550 A1 * | 8/2007 | Corredoura | G01R 13/0254 324/121 R |
| 2007/0247171 A1 | 10/2007 | O'Dowd et al. | |
| 2008/0261650 A1 * | 10/2008 | Piriyapoksombut | H04B 1/0003 455/552.1 |

(Continued)

*Primary Examiner* — Linh Nguyen
(74) *Attorney, Agent, or Firm* — Jefferson IP Law, LLP

(57) ABSTRACT

An Analog-Digital Converter (ADC) is provided. The ADC includes a plurality of sigma-delta modulators, a plurality of decimators, a plurality of differentiators, and a plurality of XOR operators. The plurality of sigma-delta modulators respectively convert analog signals to digital pulses. The plurality of decimators respectively convert a first sampling rate of a corresponding digital pulse to a second sampling rate which is lower than the first sampling. The plurality of differentiators respectively differentiate signals converted at the second sampling rate to perform delta modulation. The plurality of XOR operators extract a signal component changing with respect to the delta-modulated signals. Therefore, the number of interface pins between a modem and an RFIC can be reduced.

20 Claims, 4 Drawing Sheets

(56) References Cited

U.S. PATENT DOCUMENTS

| | | | |
|---|---|---|---|
| 2009/0098844 A1* | 4/2009 | Anandakumar | H04B 7/0857 455/207 |
| 2009/0245437 A1* | 10/2009 | Furuta | H03H 17/0621 375/344 |
| 2011/0040735 A1 | 2/2011 | Lee et al. | |
| 2011/0081880 A1* | 4/2011 | Ahn | 455/319 |
| 2011/0133968 A1 | 6/2011 | Lin et al. | |
| 2011/0159833 A1 | 6/2011 | Kensington | |
| 2013/0322575 A1* | 12/2013 | Muquet | H04L 5/001 375/340 |

* cited by examiner

US 9,362,945 B2

APPARATUS AND METHOD FOR PROVIDING INTERFACE BETWEEN MODEM AND RF CHIP

PRIORITY

This application claims the benefit under 35 U.S.C. §119 (a) of a Korean patent application filed in the Korean Intellectual Property Office on Dec. 6, 2011 and assigned Ser. No. 10-2011-0129544, the entire disclosure of which is hereby incorporated by reference.

BACKGROUND OF THE INVENTION

1. Field of the Invention

The present invention relates to a wireless communication system. More particularly, the present invention relates to an apparatus and a method for providing an efficient digital interface in cooperating with a baseband modem in a wireless communication system.

2. Description of the Related Art

The conventional wireless terminal was a receiver structure configured with one I/Q channel set, but the next generation terminal system has evolved into a Multi Input Multi Output (MIMO) structure that considers diversity and requires a plurality of I/Q channel sets. In other words, the next generation terminal system transmits/receives data via a plurality of Radio Frequency (RF) chains.

According to the related art, a 16-bit high resolution Analog-to-Digital Converter (ADC) output requires 32 bits (16× 2=32 bits) based on one I/Q channel. For example, a Radio Frequency Integrated Circuit (RFIC) including the ADC requires 32 I/O pins or a modem chip requires 32 I/O pins. Meanwhile, the next generation wireless terminal system requires a 128-bit interface (e.g., 128 input/output pins) at the minimum. For example, because the next generation terminal system having an MIMO structure that considers diversity requires 4 I/Q channel sets, and 128 (=16×2×4) I/O pins are required.

As described above, in a 4th Generation (4G) mobile communication system, as a high resolution of an ADC and a wideband requirement are raised and an MIMO structure is introduced, a situation where an interface with an external modem becomes a burden occurs. In other words, the number of I/O pins of an RFIC including an ADC increases.

Generally, the number of I/O pins of an RFIC is designed as 100 pins in total, but 128 bits are required for only an output of a reception terminal and so chipset design becomes very difficult, and the chipset should be designed as a plurality of RFIC chips separately even though a technology for realizing the chipset in a single-chip exists. Because the plurality of RFICs are used, manufacturing costs may increase.

Also, a unit price of a substrate increases due to an area occupied by 128 I/O pins, signal quality deteriorates due to interference between digital signals, and power consumption for an interface increases.

Therefore, an apparatus and a method for providing an efficient interface for reducing the number of I/O pins between an RFIC and a modem are required.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus and a method for providing an efficient interface between an Radio Frequency Integrated Circuit (RFIC) and a modem.

Another aspect of the present invention is to provide an apparatus and a method for reducing manufacturing costs of a chipset when designing a Radio Frequency (RF) terminal and reducing power consumption.

Still another aspect of the present invention is to provide an apparatus and a method for reducing the number of I/O pins between an RFIC and a modem.

In accordance with an aspect of the present invention, an Analog-Digital Converter (ADC) is provided. The ADC includes a plurality of sigma-delta modulators for respectively converting analog signals to digital pulses, a plurality of decimators for respectively converting a first sampling rate of a corresponding digital pulse to a second sampling rate which is lower than the first sampling rate, a plurality of differentiators for respectively differentiating signals converted at the second sampling rate to perform delta modulation, and a plurality of XOR operators for respectively extracting a changing signal component with respect to the delta-modulated signals.

In accordance with another aspect of the present invention, a receiver is provided. The receiver includes a baseband processor for respectively converting a plurality of RF chain signals to baseband signals, and compressing the same, an interface unit for transferring the compressed baseband signals to a modem, and the modem for demodulating the baseband signals.

In accordance with still another aspect of the present invention, an analog-digital converting method is provided. The method includes respectively converting analog signals to digital pulses, respectively converting a first sampling rate of a corresponding digital pulse to a second sampling rate which is lower than the first sampling rate, respectively differentiating signals converted at the second sampling rate to perform delta modulation, and respectively performing an XOR operation on the delta-modulated signals.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention provide an apparatus and a method for providing an interface between a modem and a Radio Frequency Integrated Circuit (RFIC). Particularly, exemplary embodiments of the present invention provide an apparatus and a method for converting an analog signal to a digital signal, and then providing an efficient digital interface when cooperating with a baseband modem in a reception terminal of a mobile communication system supporting a multi-protocol.

Figure 1:
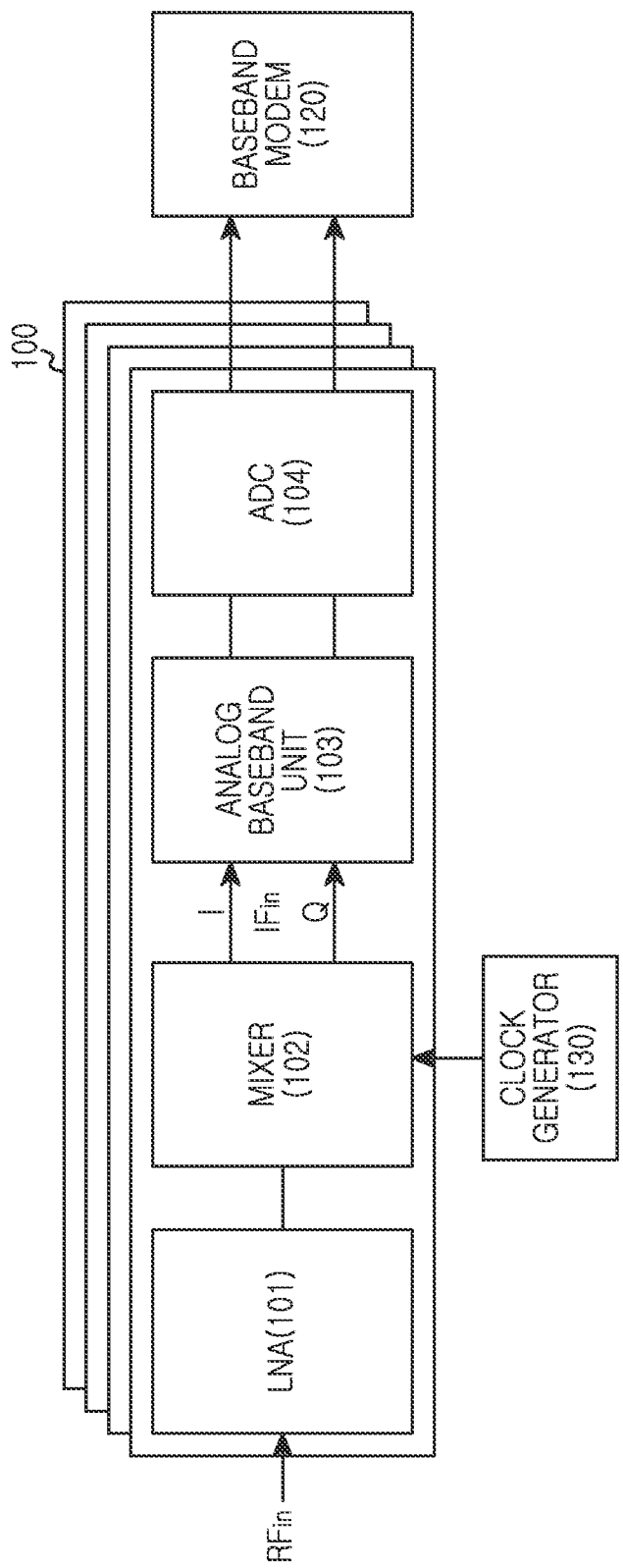
FIG. 1 is a block diagram illustrating a receiver according to an exemplary embodiment of the present invention.

FIG. 1 is a block diagram illustrating a receiver according to an exemplary embodiment of the present invention.

Referring to FIG. 1, the receiver includes an RFIC 100, a baseband modem 120, and a clock generator 130. The RFIC 100 includes a Low Noise Amplifier (LNA) 101, a mixer 102, an analog baseband unit 103, and an Analog-to-Digital Converter (ADC) 104.

The RFIC 100 converts an RF signal to a baseband signal. For this purpose, the LNA 101 processes to amplify only a signal while suppressing a noise included in the received RF signal and outputs the same to the mixer 102. The mixer 102 synthesizes a Local Oscillator (LO) frequency from the clock generator 130 and a low-noise-amplified RF signal from the LNA 101 to down-convert the RF signal to an IF band or a baseband. Depending on realization, an RF signal may be down-converted to an IF band, and then the IF band may be down-converted to the baseband. Depending on different realization, an RF signal may be directly down-converted to the baseband. The analog baseband unit 103 band-pass-filters only a desired signal among the down-converted RF signals and amplifies the same. The ADC 104 converts a down-converted RF signal from the analog baseband unit 103 to a digital signal, and then reduces a digital bit via delta conversion. The ADC 104 is described in detail with reference to FIG. 2.

The baseband modem 120 demodulates the digital signal as an information signal according to a relevant communication scheme. For example, the baseband modem 120 may demodulate a digital signal based on a Code Division Multiple Access (CDMA), Wideband Code Division Multiple Access (WCDMA), High-Speed Downlink Packet Access (HSDPA), and Long Term Evolution (LTE).

The clock generator 130 generates a Local Oscillation (LO) frequency and provides the same to the mixer 102.

Figure 2:
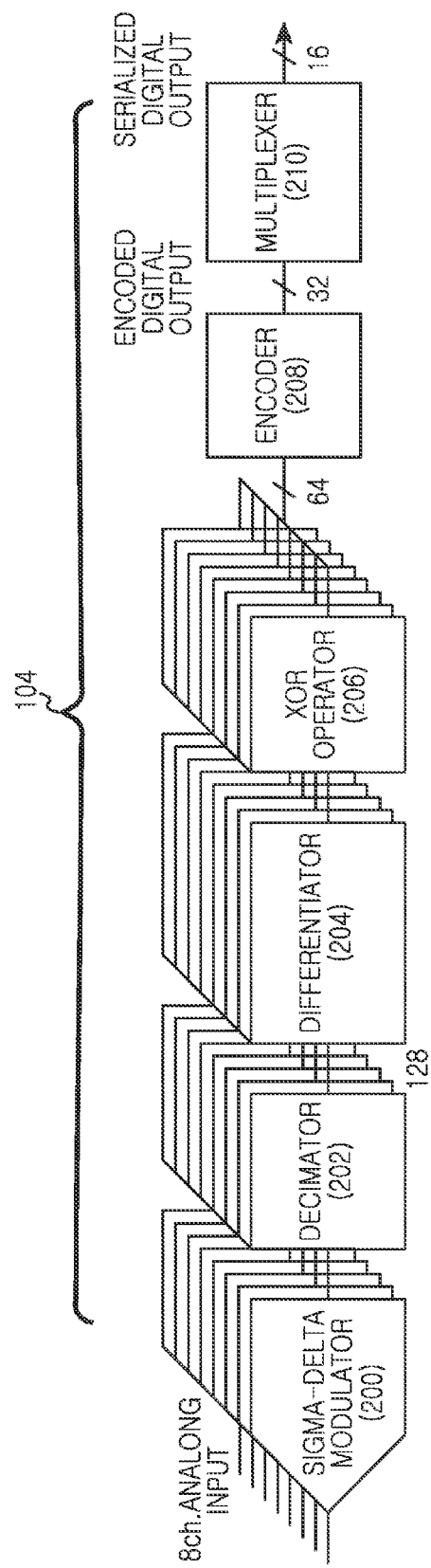
FIG. 2 is a block diagram illustrating an detailed Analog-to-Digital Converter (ADC) according to an exemplary embodiment of the present invention.

FIG. 2 is a block diagram illustrating a detailed ADC according to an exemplary embodiment of the present invention.

Referring to FIG. 2, the ADC 104 includes a plurality of sigma-delta modulators 200, a plurality of decimators 202, a plurality of differentiators 204, a plurality of XOR operators 206, an encoder 208, and a multiplexer 210. The number of the sigma-delta modulators 200, the decimators 202, the differentiators 204, the XOR operators 206 is determined depending on the number of RF chains. For example, when the number of the RF chains is 4, four sigma-delta modulators 200, four decimators 202, four differentiators 204, and four XOR operators 206 are required.

The sigma-delta modulator 200 is a circuit from a data converter for converting an analog signal from a relevant RF chain to a digital pulse to a Pulse Coded Modulation (PCM), which is a controlled oscillation circuit for generating a pulse such that an average value of the digital pulses is equal to an average value of analog input signals.

For example, the sigma-delta modulator 200 includes an integrator, a comparator, a latch, and a 1 bit Digital-to-Analog Converter (DAC). A difference between an analog input signal and an output of a fed-back 1 bit DAC passes through the integrator, and a comparator output becomes "1" in a section where an output of the integrator is positive (+), and becomes "0" in a section where an output of the integrator is negative (−). Also, the latch synchronizes an output of the comparator with a clock.

The decimator 202 performs decimation on an output signal from the sigma-delta modulator 200. For example, the decimator 202 converts a high sampling rate of a 1 bit data stream from the sigma-delta modulator 200 to a data line of a low sampling rate. The decimator 202 may include a multi-stage of a Cascaded Integrator Comb (CIC) filter and a Half Band Filter (HBF). Generally, a CIC decimator has a structure of performing successive differentiation again using a sampling clock changed after passing successive integrators.

The differentiator 204 differentiates an output signal from the decimator 202 to perform delta conversion. For example, the differentiator 204 extracts an amount of change between neighboring clock times to perform delta conversion. The delta conversion denotes recording a change of a signal level via comparison with previous sampling.

The XOR comparator 206 performs an XOR operation on an output signal from the differentiator 204 to extract only a changing component.

The encoder 208 allows binary codes to be effectively successive via horizontal-vertical conversion with respect to output signals from the plurality of XOR operators 206, and then applies encoding to reduce the number of bits. For this purpose, the encoder 208 may use a compression technology such as Joint Photo Graphic Experts Group (JPEG) and Moving Picture Experts Group (MPEG). Depending on different realization, the encoder 208 may compress data via FAX+ encoding spatially.

The multiplexer 210 multiplexes output signals in a time axis via the encoder 208 and outputs the same. For example, the multiplexer 210 outputs 4 bits in one output signal to reduce the number of interface pins by $\frac{1}{10}$ and is connected with an external modem.

Depending on different realization, the XOR operator 206 and the multiplexer 210 may be directly connected with each other and operate without the encoder 208. For example, the multiplexing technique may be used without performing compression.

Figure 3:
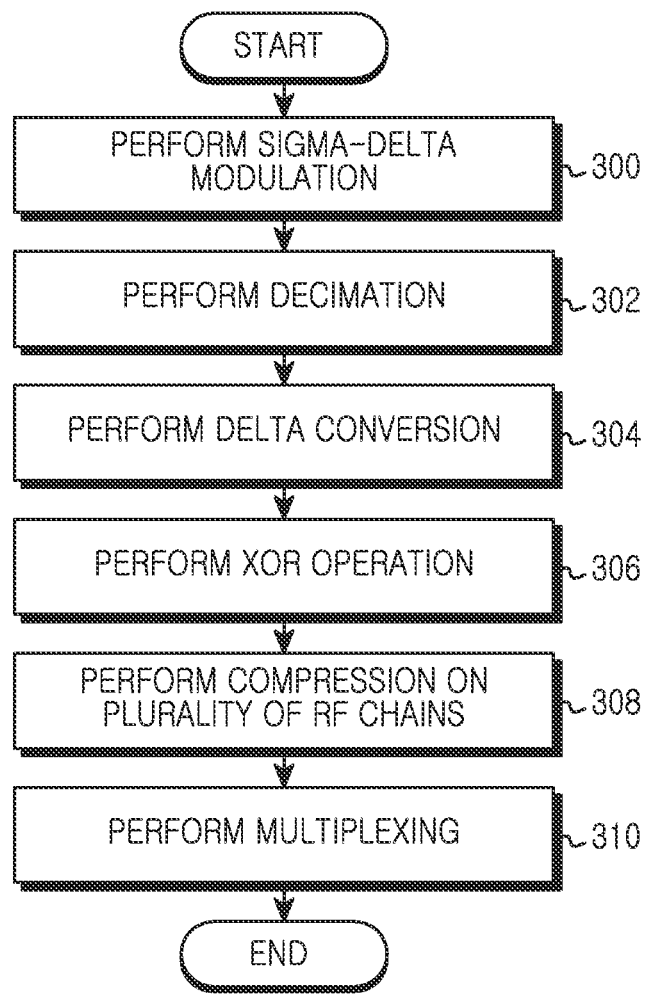
FIG. 3 is a flowchart illustrating a method for reducing a number of interface pins between a Radio Frequency Integrated Circuit (RFIC) and a modem according to an exemplary embodiment of the present invention.

FIG. 3 is a flowchart illustrating a method for reducing a number of interface pins between an RFIC and a modem according to an exemplary embodiment of the present invention.

Referring to FIG. 3, the sigma-delta modulator 200 converts an analog signal from a relevant RF chain to a digital pulse in step 300. At this point, an average value of digital pulses corresponds to a PCM for generating a pulse such that the pulse is equal to an average value of analog input signals.

After that, the decimator 202 performs decimation on an output signal from the sigma-delta modulator 200 in step 302. For example, the decimator 202 converts a high sampling rate of a 1 bit data stream from the sigma-delta modulator 200 to a data line of a low sampling rate.

After that, the differentiator 204 differentiates an output signal from the decimator 202 to perform delta conversion in step 304. For example, the differentiator 204 extracts an amount of change between neighbor clock times to perform delta conversion.

After that, the XOR operator 206 performs an XOR operation on an output signal from the differentiator 204 to extract only a changing component in step 306.

After that, the encoder 208 allows binary codes to be effectively successive via horizontal-vertical conversion with respect to output signals from the plurality of XOR operators 206, and then applies encoding to reduce the number of bits in step 308.

After that, the multiplexer 210 multiplexes output signals in a time axis via the encoder 208 and outputs the same in step 310. For example, the multiplexer 210 outputs 4 bits in one output signal to reduce the number of interface pins by 1/10 and is connected with an external modem.

After that, the procedure of the present invention ends.

Figure 4:
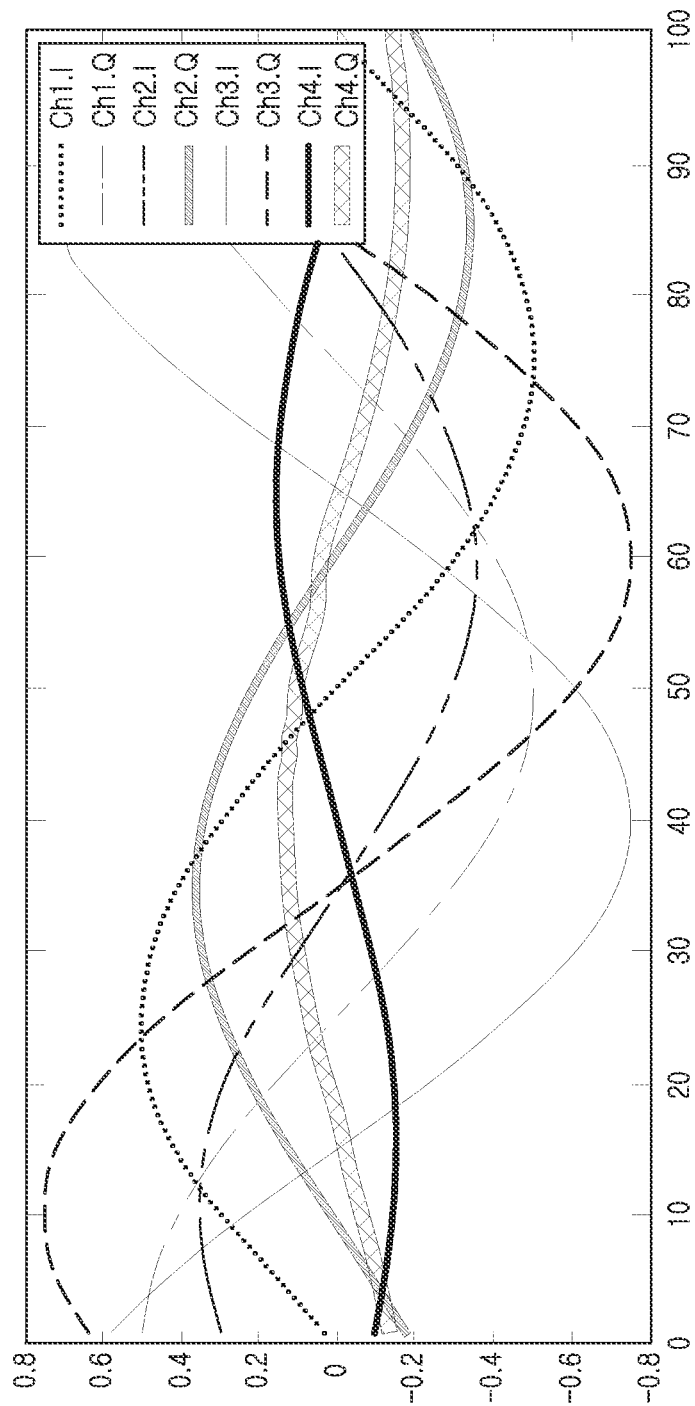
FIG. 4 is a graph illustrating eight output signals according to an exemplary embodiment of the present invention.

FIG. 4 illustrates eight output signals according to an exemplary embodiment of the present invention.

Referring to FIG. 4, output signals of a first I/Q channel, a second I/Q channel, a third I/Q channel, and a fourth I/Q channel are illustrated.

With respect to the 8 channels, data may be reduced to 8 bits via delta conversion, only a changing signal is extracted again via an XOR operation and so the number of successive 0s is maximized, and then an 8×8 matrix is formed spatially together with signals of the 8 channels.

For example, FAX+ encoding is performed spatially to compress a signal, and accordingly the number of interface pins is reduced, and then temporal sampling is performed via 4-bit multiplexing, so that the number of interface pins can be reduced.

As described above, a 128-bit multi-channel signal is reduced to 64 bits via delta conversion, and then the signal is reduced to 16 bits via a physical compression conversion circuit (e.g., FAX+, and the like) and time division multiplexing, so that the number of interface pins between a modem and an RFIC can be reduced. Also, an I/O interface structure is simplified and so a chipset is easily manufactured, so that a unit price of a chipset is lowered and power consumption used by a digital interface may be reduced to a level of ¼.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described exemplary embodiments but should be determined by not only the appended claims but also the equivalents thereof.

What is claimed is:

1. An Analog-Digital Converter (ADC), the ADC comprising:
   a plurality of sigma-delta modulators for respectively converting analog signals to digital pulses;
   a plurality of decimators for respectively converting a first sampling rate of a corresponding digital pulse to a second sampling rate which is lower than the first sampling rate;
   a plurality of differentiators for respectively differentiating signals converted at the second sampling rate to perform delta modulation; and
   a plurality of XOR operators for respectively extracting a changing signal component with respect to the delta-modulated signals.

2. The ADC of claim 1, further comprising:
   an encoder for reducing a number of output bits by compressing output signals from the plurality of XOR operators.

3. The ADC of claim 2, wherein the encoder uses an algorithm compressing the output signals from the plurality of XOR operators via a horizontal-vertical conversion structure.

4. The ADC of claim 1, further comprising:
   a multiplexer for performing multiplexing on output signals which are operatively output from the plurality of XOR operators.

5. The ADC of claim 1, wherein the plurality of XOR operators respectively perform an XOR operation on a delta-modulated first signal, and a second signal following the first signal in time and delta-modulated after passing through the corresponding sigma-delta modulator, the corresponding decimator, and the corresponding differentiator.

6. The ADC of claim 1, wherein the plurality of sigma-delta modulators respectively comprise:
   an integrator for integrating a difference between an analog input signal and a fed-back 1 bit output of a Digital-Analog Converter (DAC);
   a comparator for outputting "1" in a section where an output of the integrator is positive (+) and outputting "0" in a section where an output of the integrator is negative (−); and
   a latch for synchronizing an output of the comparator with a clock.

7. The ADC of claim 1, wherein a number of the plurality of sigma-delta modulators, the plurality of decimators, and the plurality of differentiators is determined by the number of Radio Frequency (RF) chains.

8. The ADC of claim 1, wherein the plurality of XOR operators respectively extract a changing signal component with respect to the delta-modulated signals using an XOR operation.

9. A receiver comprising:
   a baseband processor configured to:
      convert a plurality of Radio Frequency (RF) chain signals to baseband signals by converting the plurality of RF chain signals to digital signals,
      convert a high sampling rate of at least a portion of the digital signals to a low sampling rate using a decimator,
      differentiate signals converted to the low sampling rate,
      perform a delta conversion on the differentiated signals having the low sampling rate,
      extract, using a plurality of XOR operators, a changing signal component with respect to the delta-modulated signals, and
      compress the baseband signals based on a result of the plurality of XOR operators; and an interface unit configured to transfer the compressed baseband signals to a modem, wherein the modem demodulates the baseband signals.

10. The receiver of claim 9, wherein the baseband processor comprises:
- a plurality of Low Noise Amplifiers (LNAs) for amplifying a plurality of RF chain signals;
- a plurality of mixers for down-converting the low-noise amplified RF chain signals;
- a plurality of analog baseband units for respectively filtering and amplifying the down-converted RF chain signals; and
- a plurality of Analog-to-Digital Converters (ADCs) for converting the amplified down-converted RF chain signals to digital signals.

11. The receiver of claim 10, wherein the plurality of ADCs respectively comprise:
- a plurality of sigma-delta modulators for respectively converting analog signals to digital pulses;
- a plurality of decimators for respectively converting a first sampling rate of a corresponding digital pulse to a second sampling rate which is lower than the first sampling rate;
- a plurality of differentiators for respectively differentiating signals converted at the second sampling rate to perform delta modulation; and
- a plurality of XOR operators for performing an XOR operation on the delta-modulated signals.

12. The receiver of claim 11, further comprising:
an encoder for reducing a number of output bits by compressing XOR-operated signals.

13. The receiver of claim 12, wherein the encoder uses an algorithm compressing the XOR-operated signals via a horizontal-vertical conversion structure.

14. The receiver of claim 11, further comprising:
a multiplexer for performing multiplexing on XOR-operated signals to reduce the number of output bits.

15. An analog-digital converting method, the method comprising:
respectively converting analog signals to digital pulses;
respectively converting a first sampling rate of a corresponding digital pulse to a second sampling rate which is lower than the first sampling rate;
respectively differentiating signals converted at the second sampling rate to perform delta modulation; and
respectively performing an XOR operation on the delta-modulated signals.

16. The method of claim 15, further comprising:
reducing a number of output bits by compressing XOR-operated signals.

17. The method of claim 15, further comprising:
using an algorithm compressing XOR-operated signals via a horizontal-vertical conversion structure.

18. The method of claim 15, further comprising:
performing multiplexing on XOR-operated signals to reduce the number of output bits.

19. The method of claim 15, wherein the performing of the XOR operation on the delta-modulated signals comprises:
performing the XOR operation on a delta-modulated first signal, and a second signal following the first signal in time and delta-modulated via the first operation to third operation.

20. The method of claim 15, wherein the converting of the analog signals to the digital pulses, respectively, comprises:
integrating a difference between an analog input signal and a fed-back 1 bit output of a Digital-Analog Converter (DAC);
outputting "1" in a section where an output of the integration result is positive (+) and outputting "0" in a section where an output of the integration result is negative (−); and
synchronizing the output with a clock.

* * * * *